United States Patent [19]
Hahn

[11] Patent Number: 5,120,257
[45] Date of Patent: Jun. 9, 1992

[54] LANCED HOLD-DOWNS

[75] Inventor: Marlyn E. Hahn, York, Pa.

[73] Assignee: E. I. Du Pont de Nemours and Company, Wilmington, Del.

[21] Appl. No.: 654,869

[22] Filed: Feb. 13, 1991

[51] Int. Cl.⁵ .......................................... H01R 13/428
[52] U.S. Cl. ..................................... 439/567; 439/82; 439/733
[58] Field of Search ............... 411/456, 508, 509, 510, 411/913; 439/82, 552–555, 557, 567, 571, 733, 751

[56] References Cited

U.S. PATENT DOCUMENTS

| | | | |
|---|---|---|---|
| 1,417,818 | 5/1922 | Frost | 411/456 |
| 2,006,813 | 7/1935 | Norwood | 411/510 |
| 3,882,755 | 5/1975 | Enstrom | 411/456 |
| 4,332,431 | 6/1982 | Bobb et al. | 439/751 |
| 4,717,219 | 1/1988 | Frantz et al. | 439/82 |
| 4,735,587 | 4/1988 | Kirayogin | 439/82 |
| 4,847,588 | 7/1989 | Doutrich | 439/82 |
| 4,907,978 | 3/1990 | Bowen | 439/79 |
| 4,986,765 | 1/1991 | Korsunsky et al. | 439/326 |
| 4,993,975 | 2/1991 | Asick et al. | 439/78 |

FOREIGN PATENT DOCUMENTS 56-114078  2/1991  Japan .

OTHER PUBLICATIONS

Erol M. Kirayoglu, "Board Retentive Solder Tails: A Design for 0.025" Square Posts", Connection Technology, Sep. 1986, pp. 19 and 20.

Primary Examiner—Gary F. Paumen
Attorney, Agent, or Firm—John E. Griffiths

[57] ABSTRACT

The present invention relates to hold-downs for securing components to circuit assemblies and more particularly to lanced hold-downs for securing connectors to printed circuit boards.

18 Claims, 6 Drawing Sheets

LANCED HOLD-DOWNS

BACKGROUND OF THE INVENTION

1. Field of the Invention

This invention relates to hold-downs for securing components to circuit assemblies and more particularly to lanced hold-downs for securing connectors to printed circuit boards.

2. Description of Related Art

Various apparatus exist for locating and securing connectors onto printed circuit boards (PCBs) prior to and during soldering of terminals mounted in the connector to the circuit assembly.

Terminal pins of through-mount connectors have been aligned or crimped to secure connectors onto PCBs. See, for instance, U.S. Pat. Nos. 4,907,978 and 4,847,588. However, these hold-downs do not work well for softer or more flexible terminals. Further, the non-parallel alignment of pin tails as disclosed in U.S. Pat. No. 4,907,978 requires the pin tails to be bent into a straightened position in order to insert the pin tails into standard parallel rows of holes.

Terminal pins of through-mount connectors have been configured to secure the connector to a PCB by causing an interference fit between press-fit sections of the terminals within plated-through holes in a PCB. For instance, U.S. Pat. No. 4,735,587 discloses a header with two rows of pins with selected opposed pin pairs having cantilever retention arms for engaging interior surfaces of circuit board holes to hold the header to a circuit board prior to and during soldering. The pins are held in the board holes merely by the interference fit between linear corners or edges of the pins against the wall of the board holes. The particular shape and orientation of the retention arms results in the need for a relatively high insertion force in order to press the pin into a hole.

Other hold-downs that are separate from the connector terminals have been disclosed or used for securing either surface-mount connectors or through-mount connectors to PCBs. Rivets or nut and bolt assemblies have been used for this purpose. Other such apparatus are disclosed, for instance, in U.S. Pat. No. 4,717,219. These hold-down apparatus take up a relatively large surface area of the connector and PCB. Further, these hold-downs typically require a secondary operation after the hold-down is inserted in a board hole to spread the hold-down out to retain the hold-down in the hole. Other generally flat hold-downs are disclosed that take up less surface space on a PCB. See, for instance, U.S. Pat. No. 4,907,987. However, the retention force caused by the interference fit between this hold-down in a connector housing is low which may necessitate the use of a special seating tool to connect such a hold-down to a board.

Solder tail portions of through-mount terminals have been cut or lanced forming a finger angled with respect to the flat sides of the solder tails. The finger comprises a compliant section for forming an interference fit in a plated-through hole in a PCB. However, softer metal solder tails having a similarly formed angled finger buckle when forced into or towards a similarly sized plated-through hole.

It is an object of this invention to provide a hold-down that can be used to hold down a connector on a printed circuit board at least while terminals mounted in the connector are soldered to the circuit board.

It is an object of this invention to provide the hold-down such that it can be used to hold down either a through-mount connector or a surface mount connector onto a printed circuit board.

It is an object of this invention to provide the hold-down such that it can be part of one of the terminals or contact elements mounted in the housing or apart from the connector terminals.

These and other objects of the invention will be clear from the following description.

SUMMARY OF THE INVENTION

This invention is related to a lanced hold-down for holding a connector to a circuit assembly. The lanced hold-down comprises a first portion, a second portion, a third portion and a fourth portion. The first portion comprises a substantially flat strip having a pair of first sides and a pair of first edges. The second portion is connected to the first portion. The second portion comprises a substantially flat strip having a pair of second sides and a pair of second edges. The third portion is connected to the second portion. The third portion has a pair of third sides and at least one inclined edge configured to facilitate insertion into a hole through the circuit assembly. The fourth portion is connected to the third portion. The fourth portion comprises a substantially flat finger having a pair of fourth sides and at least three fourth edges. The fourth edges interconnect the fourth sides. A first one of the three fourth edges is a ramp for causing an interference fit with a wall of a hole through the circuit assembly. The first one of the fourth edges intersects a second one of the fourth edges forming a barb such that the ramp allows easy insertion in the hole, but the barb digs into the hole wall if the hold-down is withdrawn from the hole. The fourth portion is progressively farther away from the second portion as distance increases from the third portion. As such, when the hold-down is pressed into a hole through the circuit assembly, the ramp slides against the wall defining the hole and the fourth portion compresses towards the second portion forming an interference fit within the hole.

BRIEF DESCRIPTION OF THE DRAWINGS

The invention can be more fully understood from the following detailed description thereof in connection with accompanying drawings described as follows.

DESCRIPTION OF THE PREFERRED EMBODIMENT(S)

Figure 1:
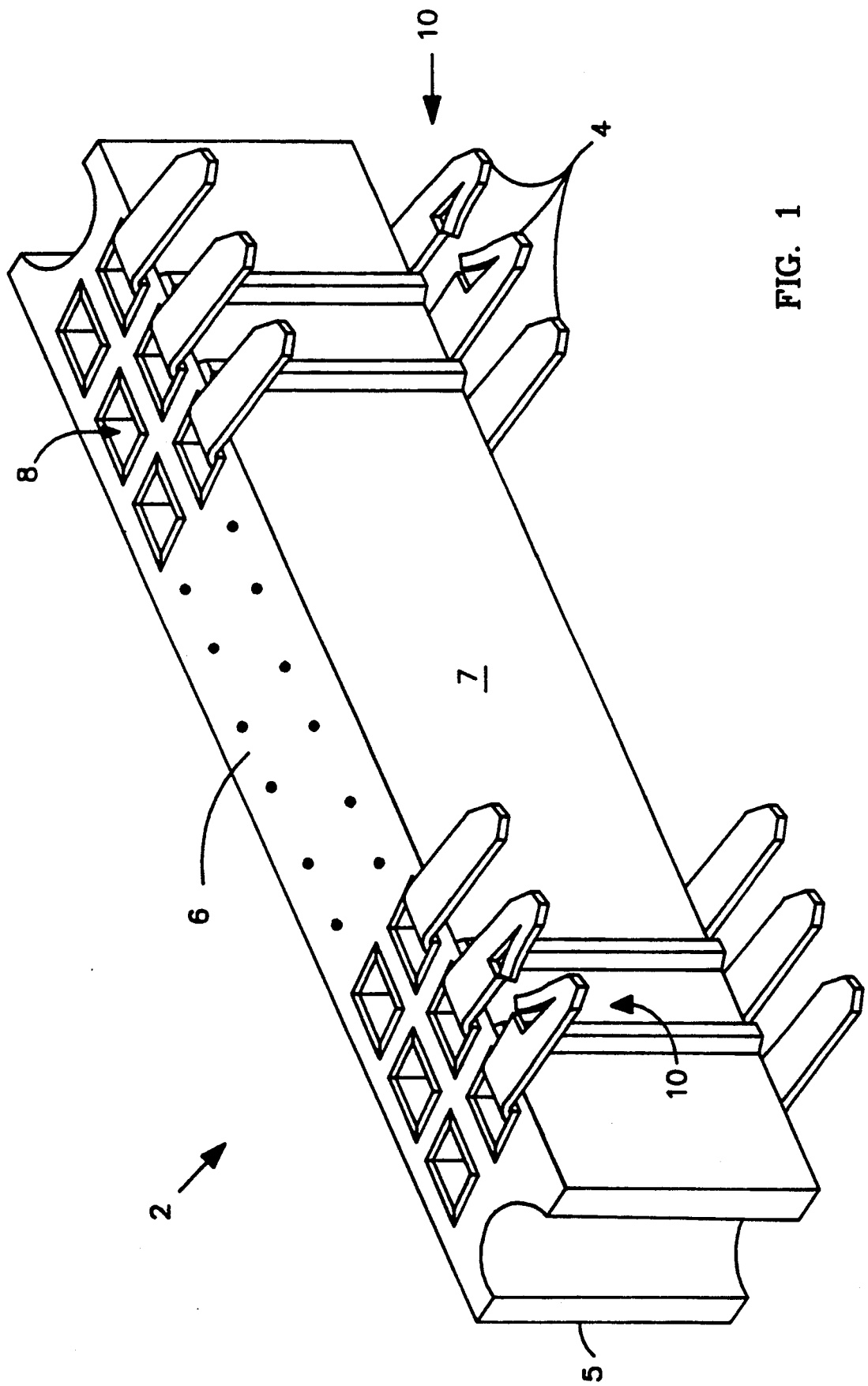
FIG. 1 is a perspective view of a right angle, through-mount, horizontal card connector having terminals with solder tails made into hold-downs in accordance with the present invention.

Throughout the following detailed description, similar reference characters refer to similar elements in all figures of the drawings.

Figure 6:
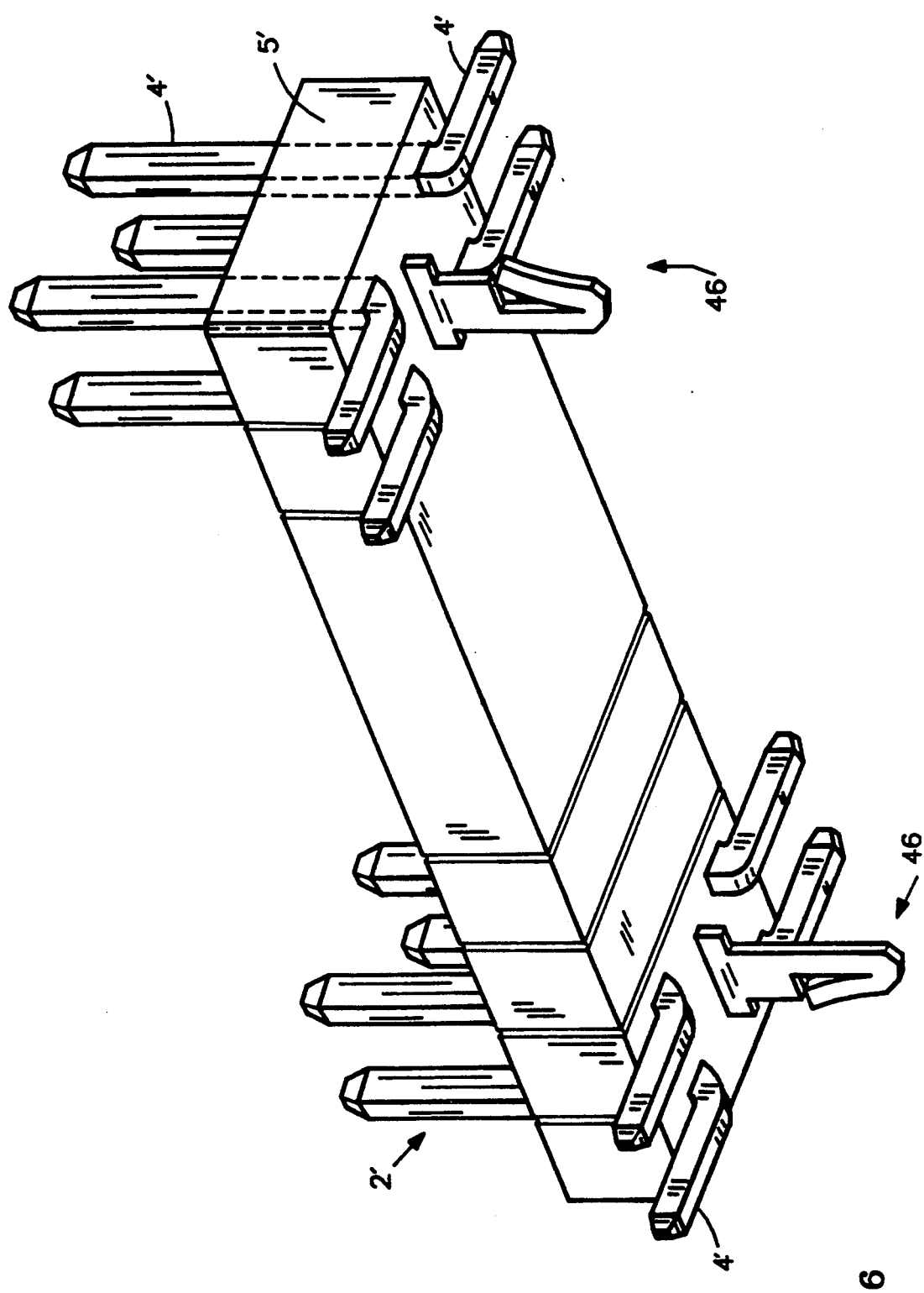
FIG. 6 is a perspective view of a connector having surface-mount terminal pins and hold-downs in accordance with the present invention.

Referring to FIG. 1, there is illustrated a perspective view of a connector 2 having lanced hold-downs in accordance with the present invention. Although the lanced hold-downs 10 of the present invention can be used to secure virtually any electrical connector to a circuit assembly, FIG. 1 illustrates the lanced hold-downs 10 on or as part of solder tails of electrical terminals 4 of a right angle, through-mount, horizontal card connector 2. Alternatively, the hold-downs of the present invention can be in addition to, or apart or distinct from, the connector electrical terminals 4', such as, when the connector 2' is a surface mount connector 2' as illustrated in FIG. 6.

The connector 2 illustrated in FIG. 1 has a dielectric housing 5 having a first mating surface 6 and a second mating surface 7. A plurality of passages 8 extend in rows and columns through the housing 5. A plurality of electrical terminals 4 are mounted in the passages 8. The terminals 4 are through-mount terminals having solder tails arranged in rows and columns for inserting into and soldering to plated through-holes in a circuit assembly. The connector 2 of FIG. 1 has one or more pair(s) of the terminals 4 adjacent to one another at opposite ends of two different rows of the electrical terminals 4 made into the lanced hold-downs 10 in accordance with the present invention.

The term "circuit assembly" is intended to include any assembly that includes a plurality of conductors, leads, plated through holes or conductive paths, pads or areas. The circuit assembly can be a printed wiring board or a printed circuit board, such as a backpanel, a mother board or a daughter board. The circuit assembly can be rigid or flexible.

Figure 2:
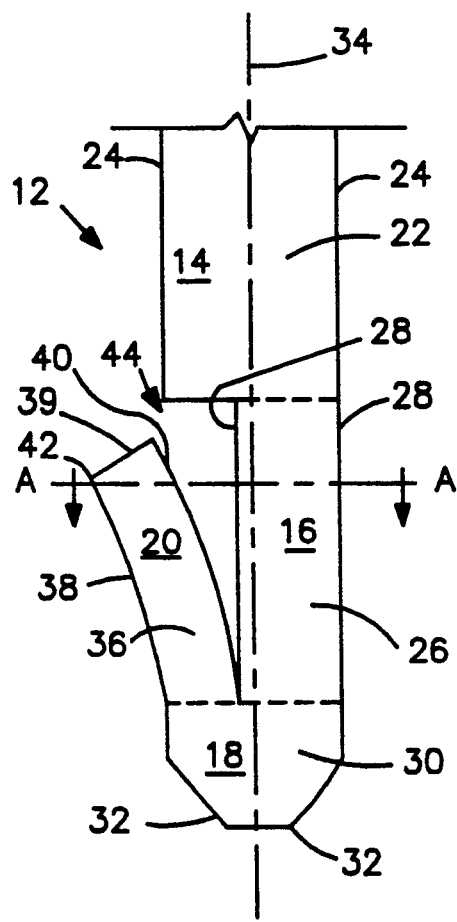
FIG. 2 is a side view of an end section of a hold-down in accordance with the present invention.

FIG. 2 is a side view of a first embodiment of an end section 12 of the lanced hold-down 10 illustrated in FIG. 1. The lanced hold-down 10 comprises a first portion 14, a second portion 16, a third portion 18 and a fourth portion 20. For ease of understanding, dotted lines have been inserted in FIG. 2 to show where these portions 14,16,18,20 connect to one another.

The first portion 14 comprises a substantially flat strip having a pair of first sides 22 and a pair of first edges 24. The pair of first edges 24 interconnect the pair of first sides 22.

The second portion 16 is connected to the first portion 14. The second portion 16 comprises a substantially flat strip having a pair of second sides 26 and a pair of second edges 28. The pair of second edges 28 interconnects the pair of second sides 26.

The third portion 18 is connected to the second portion 16. The third portion 18 has a pair of third sides 30 and at least one inclined edge 32 configured to facilitate insertion of the third portion 18 into a hole through the printed circuit board. FIG. 2 illustrates a pair of edges 32 that are inclined with respect to a longitudinal axis 34 of the hold-down 10. However, there could be, for instance, one curved edge or several curved edges, instead of two inclined edges 32. The curved edge(s) or inclined edges 32 interconnect the pair of third sides 30. The first portion 14 and the third portion 18 are generally symmetric about the longitudinal axis 34.

The fourth portion 20 is connected to the third portion 18. The fourth portion 20 comprises a substantially flat finger having a pair of fourth sides 36 and at least three fourth edges 38,39,40. The fourth portion 20 has a first fourth edge 38, a second fourth edge 39 and a third fourth edge 40. The fourth edges 38,39,40 interconnect the pair of fourth sides 36. The first one 38 of the three fourth edges comprises a ramp for causing an interference fit with a wall of a hole through the printed circuit board. The smaller this angle is, the greater the mechanical advantage in inserting the hold-down 10 in a PCB hole. The ramp 38 has a width that is the thickness of the fourth portion 20. The first one 38 of the fourth edges intersects the second one 39 of the fourth edges forming a barb 42 such that the ramp 38 allows easy insertion of the hold-down 10 into the hole. However, the barb 42 digs into the hole wall if the hold-down 10 is withdrawn from the hole. The fourth portion 20 is progressively farther away from the second portion 16 as distance increases from the third portion 18. Further, the width of the second portion 16 plus the width of the fourth portion 20 equals or substantially equals the width of the first portion 14. The first fourth edge 38 and the third fourth edge 40 can be substantially parallel or slightly tapered towards one another farther from the third portion 18. Preferably, the width of the fourth portion 20 is less than the width of the second portion 16.

Figure 3:
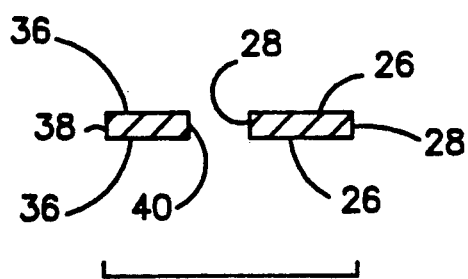
FIG. 3 is a first embodiment of a cross sectional view generally along line A—A in FIG. 2 taken in the direction of the arrows.

FIG. 3 is a first embodiment of a cross sectional view taken generally along line A—A in FIG. 2 in the direction of the arrows. In this embodiment, one (or a first) side of the pair of first sides 22, the pair of second sides 26, the pair of third sides 30 and the pair of fourth sides 36 are coplanar or substantially coplanar. Further, the other (or a second) side of the pair of first sides 22, the pair of second sides 26, the pair of third sides 30 and the pair of fourth sides 36 are coplanar or substantially coplanar. In this embodiment, the fourth portion 20 is spaced from the first portion 14 when the fourth portion 20 is compressed to contact the second portion 16. In other words, if the fourth portion 20 was bent entirely towards the second portion 16 such that the third edge 40 of the fourth portion 20 and the adjacent edged 28 of the second portion 16 were contacting and flush with one another, a gap 44 would exist between the second edge 39 of the fourth portion 20 and the first portion 14. The gap 44 exists to allow the fourth portion 20 to be bent towards the second portion 16 without the second edge 39 contacting the first portion 14. In order to make this embodiment, a slug of the terminal 4 can be removed to form the gap 44.

Figure 4:
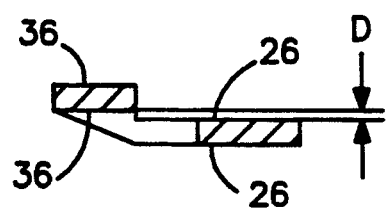
FIG. 4 is a second embodiment of a cross sectional view generally along line A—A in FIG. 2 taken in the direction of the arrows.

FIG. 4 is a second embodiment of a cross sectional view taken generally along line A—A in FIG. 2 in the direction of the arrows. In this embodiment, the fourth portion 26 has been bent providing a slight clearance D (perpendicular or substantially perpendicular to the sides 26 of the second portion 16 or the sides 36 of the fourth portion 20) between the second portion 16 and the fourth portion 20 at about the second edge 39 of the fourth portion 20. In this embodiment, one (or a first) side of the pair of first sides 22, the pair of second sides 26 and the pair of third sides 30 are coplanar or substantially coplanar. Further, the other (or a second) side of the pair of first sides 22, the pair of second sides 26 and the pair of third sides 30 are coplanar or substantially coplanar. In this embodiment, a slug of material does not have to be removed to form a gap between the fourth portion 20 and the first portion 16. In other words, in this embodiment, if the fourth portion 20 was pressed such that its sides 36 were coplanar with the sides 22 of the first portion 14 and if the fourth portion 20 was bent entirely towards the second portion 16 such that the third edge 40 of the fourth portion 20 and the adjacent edge 28 of the second portion 16 were contacting and flush with one another, a gap would not exist between the second edge 39 of the fourth portion 20 and the first portion 14. The clearance D is no larger than is necessary to enable the fourth portion 20 to bend into contact with the second portion 16 without the second edge 39 of the fourth portion contacting the first portion 14. The clearance D is preferably equal to or less than about 0.001 inches.

Figure 5:
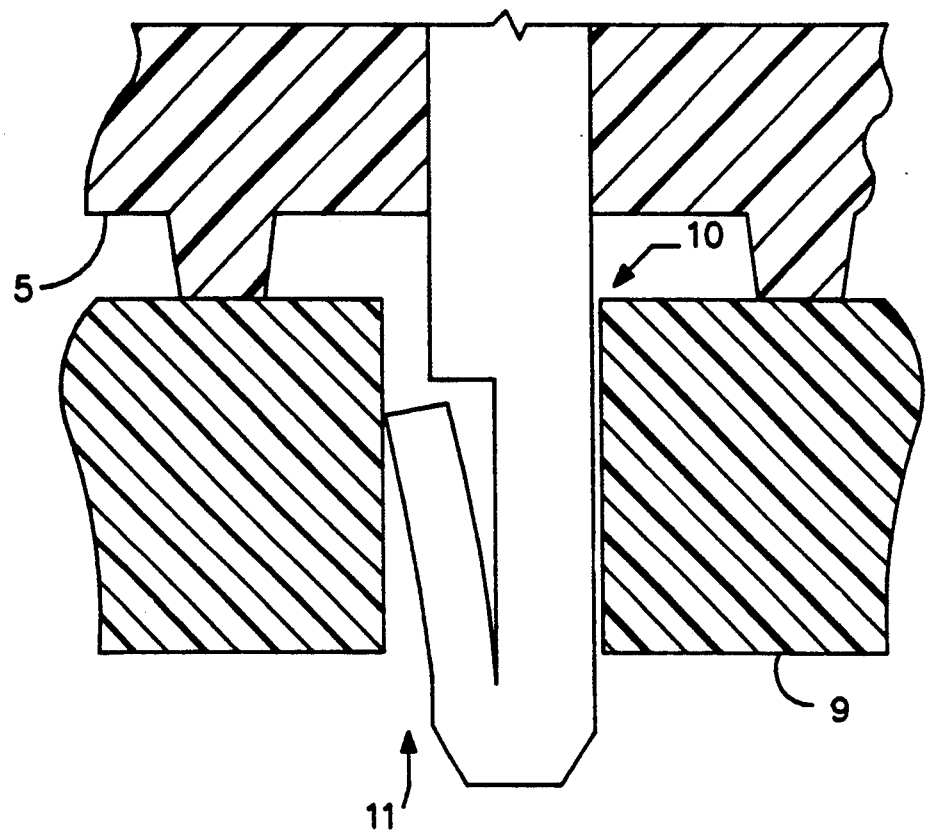
FIG. 5 is a cross sectional view of the hold-down of FIG. 2 press-fit in a hole through a circuit board in accordance with the present invention.

In operation, when the hold-down 10 illustrated in either FIG. 3 or FIG. 4 is forced or pressed into a hole through a PCB, one of the pair of second edges 28 and one of the fourth edges (i.e., the ramp 38) compress against the wall defining the hole. Note that the edges 28 and 38 that contact the hole wall comprise flat surfaces extending the entire thickness of the end section 12, rather than mere linear corners. As a result, referring to FIG. 5, the fourth portion 20 will bend towards the second portion 16 forming an interference fit within the hole 11. As explained above, if the hold-down 10 was withdrawn back up the hole 11, the barb 42 will grab or dig into the hole wall further deterring removal of the hold-down 10 from the PCB 9.

The hold-down of FIG. 3 can be made by the following process. Solder tails of through mount terminals secured to a connector housing can be placed in grooves or a nest in a die. Then, a punch can simultaneously cut out the slug from two adjacent solder tails 4 forming the gap 44. Third, another punch with an inclined cutting edge lances the fourth portion 20 from the second portion 16. This includes a cutting or shearing of the solder tail 4. It further includes bending or curling the fourth portion 20 away from the second portion 16 both in a direction perpendicular to the longitudinal axis 34 and perpendicular to the second sides 26. Fourth, the fourth portion 20 is pressed or forced in a direction perpendicular to the second sides 20 until the hold-down is in the shape depicted in FIG. 3. More specifically, the sides 36 of the fourth portion 20 are pressed or forced to be coplanar with the sides 26 of the second portion 16.

The hold-down of FIG. 4 can be made by the same process. However, a slug does not need to be punched out. Further, in the last step, the fourth portion is pressed until it is shaped as depicted in FIG. 4. More specifically, the sides 36 of the fourth portion 20 are pressed or forced towards the planes intersecting the sides 26 of the second portion 16, but the sides 36 are not fully returned to be coplanar with the sides 26.

Figure 7:
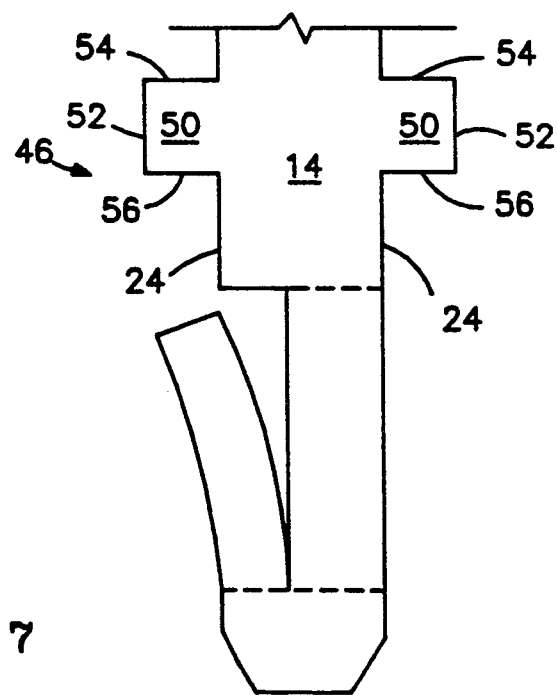
FIG. 7 is a side view of a second embodiment of an end section of a hold-down in accordance with the present invention.

FIG. 7 is a side view of another embodiment of an end section 46 of a hold-down in accordance with the present invention. This embodiment can be the same as any of the embodiments illustrated in FIGS. 2-5, except it has a stand-off or stop 50. The stand-off or stop 50 comprises a pair of tabs 52 extending in opposite directions from the edges 24 of the first portion 14. The tabs 52 have opposing first and second shoulders 54,56. The first shoulders 54 are on the connector side of the tabs 52 and can be used to stop further insertion of the hold-down into or through the connector housing. The second shoulders 56 can be used to contact the PCB or block further insertion of the hold-down into the board hole thereby providing the height of the tabs 52 as a clearance or stand-off between the connector housing and the PCB to allow cleaning after soldering. FIG. 6 illustrates the end section 46 extending from a housing 5' of a surface mount connector 2' apart or distinct from the connector electrical terminals 4'.

Figure 8:
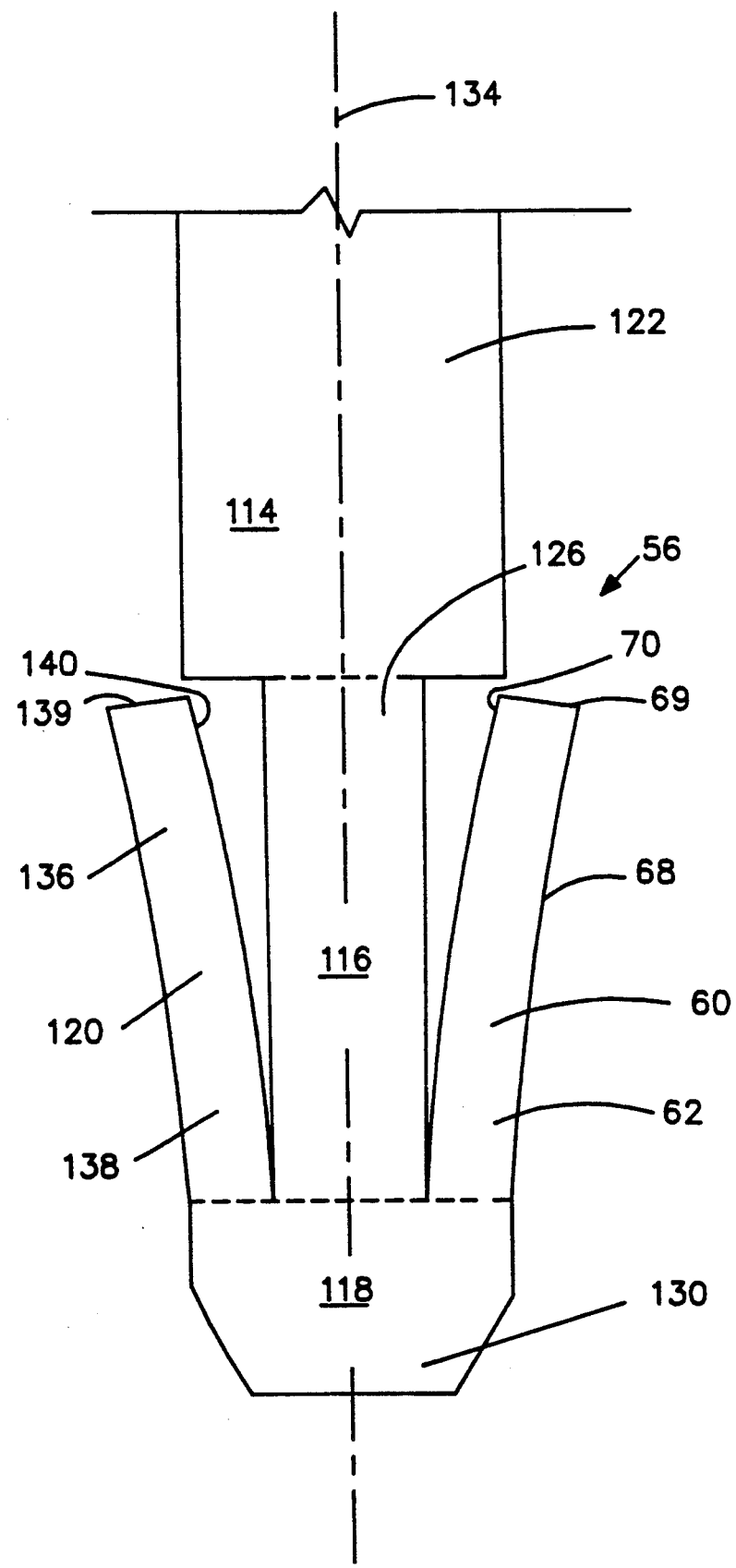
FIG. 8 is a side view of a third embodiment of an end section of a hold-down in accordance with the present invention.

FIG. 8 is a side view of another embodiment of an end section 56 of a hold-down in accordance with the present invention. This embodiment is best used in holes having a diameter of no less than about 0.06 inches. This embodiment can be the same as any of the embodiments illustrated in FIGS. 2-7, except it has a fifth portion 60. Parts of end section 56 that correspond to parts of end section 12 are designated by the same number increased by 100. The fifth portion 60 is connected to the third portion 118. The fifth portion 60 comprises a substantially flat finger having a pair of fifth sides 62 and first, second and third fifth edges 68,69,70. The fifth edges 68,69,70 interconnect the pair of fifth sides 62. The fifth portion 60 is progressively farther away from the second portion 116 as distance increases from the third portion 118. Further, in this embodiment the second portion 116 is also symmetric about a longitudinal axis 134.

Like the embodiment illustrated in FIG. 3, the embodiment of FIG. 8 can have one side of the pair of first sides 122, the pair of second sides 126, the pair of third sides 130, the pair of fourth sides 136 and the pair of fifth sides 62 being coplanar. Further, the other side of the pair of first sides 122, the pair of second sides 126, the pair of third sides 130, the pair of fourth sides 136 and the pair of fifth sides 62 can be coplanar. Alternatively, like the embodiment illustrated in FIG. 4, the embodiment of FIG. 8 can have a slight clearance D perpendicular or substantially perpendicular to the sides 126 of the second portion 116 or the fourth portion 120 between the second portion 116 and the fourth portion 120 at about the second edge 139 of the fourth portion 120. Similarly, the embodiment of FIG. 8 can have a slight clearance D' perpendicular or substantially perpendicular to the sides 126 of the second portion 116 or the fifth portion 60 between the second portion 116 and the fifth portion 60 at about the second edge 69 of the fifth portion 60. As seen in FIG. 8, a plane perpendicular to the first, second and third sides 122,126,130 can bisect the first, second and third portions 114,116,118 such that the hold-down on either side of the plane is substantially a mirror image of the hold-down on the other side of the plane. The clearances D and D' can extend in the same or opposite directions. Further, the width of the second portion 116 plus the width of the fourth portion 120 plus the width of the fifth portion 60 equals or substantially equals the width of the first portion 116.

In operation, the hold-down is pressed into a hole through a printed circuit board such that one 138 of the fourth edges and one 68 of the fifth edges compress against the wall defining the hole. As a result, the fourth portion 120 and the fifth portion 60 will bend towards the second portion 116 forming an interference fit within the hole.

Figures 9, 10:
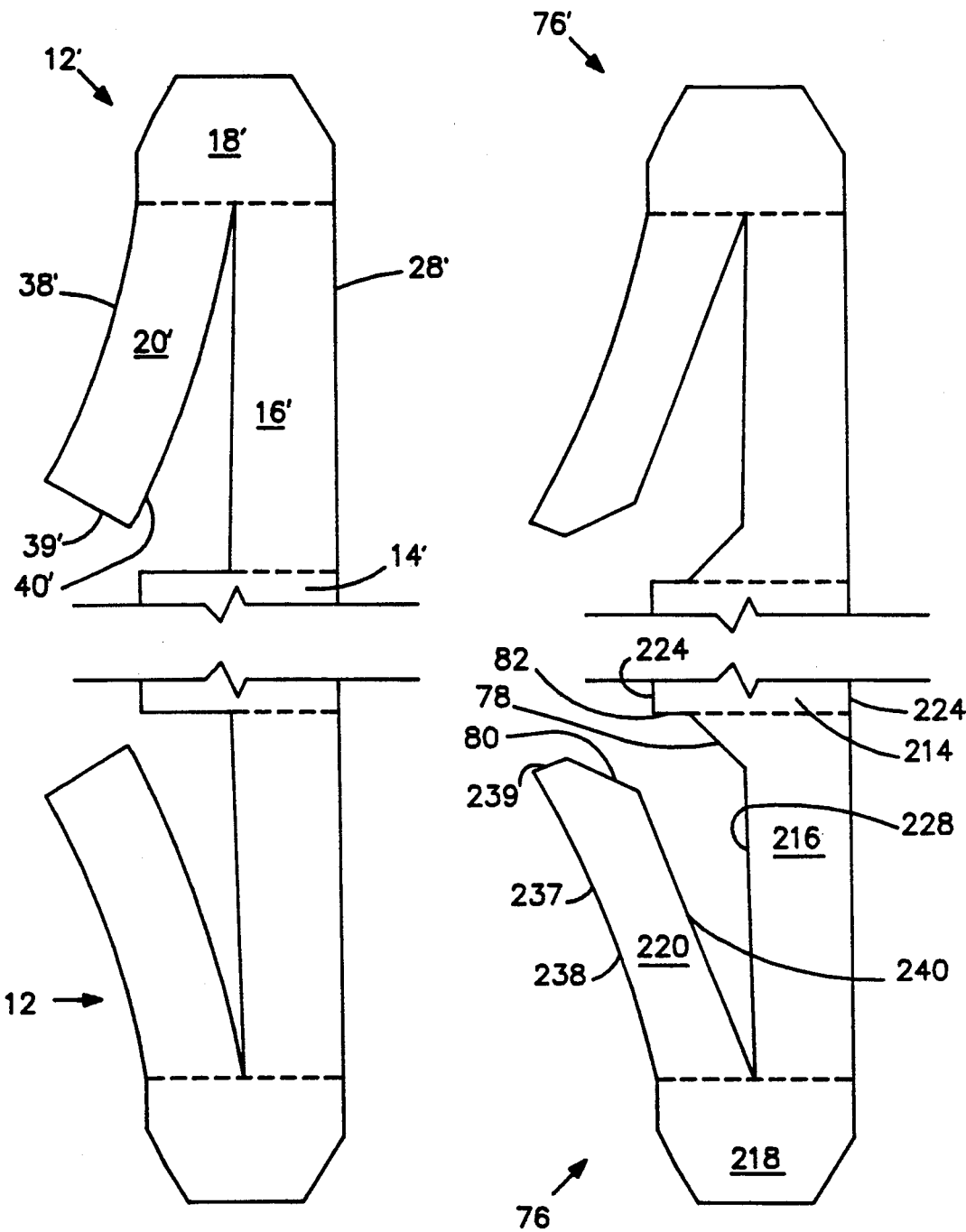
FIG. 9 is a side view of a hold-down with two end sections being mirror images of one another.
FIG. 10 is a side view of a hold-down with two end sections with a first end section being a fourth embodiment of an end section of a hold-down in accordance with the present invention and the second end section being a mirror image of the first end section.

FIG. 9 is a side view of a hold-down with two end sections 12,12' where the end section 12' is a mirror image of the end section 12 of FIG. 2. More specifically, the first portion 14, the second portion 16, the third portion 18 and the fourth portion 20 comprise the first end section 12. The lanced hold-down further includes a second end section 12' comprising or substantially comprising a mirror image of the first end section 12. The second end section 12' is for insertion into a hole in a housing of a connector such that one of the pair of second edges 28' in the second end section 12' and one of the fourth edges 38' in the second end section 12' compress against the housing wall defining the hole in the housing. The fourth portion 20' in the second end section 12' will bend towards the second portion 16' in the second end section 12' forming an interference fit within the hole in the housing. An insertion end of the third portion 18' will contact an end or bottom of the hole in the housing preventing further insertion therein.

FIG. 10 is a side view of another hold-down with a first end section 76 being a fourth embodiment of an end section of a hold-down in accordance with the present invention. The hold-down further comprises a second end section 76' which is a mirror image of the first end section 76. Parts of end section 76 that correspond to parts of end section 12 are designated by the same number increased by 200. The end section 76 can be the same as the embodiment illustrated in FIG. 2, except (1) it has no gap 44 between the fourth portion 220 and the first portion 214 when the fourth portion 220 is bent into contact with the second portion 216 and (2) the second portion 216 and the fourth portion 220 include mating inclined linear edges 78,80. Since there is no gap 44, no slug needs to be punched out in its manufacturing process. The inclined linear edge 78 of the second portion 216 interconnects one of the pair of second edges 228 and a shoulder edge 82 extending perpendicularly from one of the pair of the first edges 224. Further, the inclined linear edge 80 of the fourth portion 220 interconnects the second fourth edge 239 and the third fourth edge 240 extending from the first fourth edge 238. This embodiment allows the fourth portion 220 not to contact the first portion 214 before the fourth portion 220 is compressed into most or virtually all of the space originally between the fourth portion 220 and the second portion 216 when the hold-down is inserted into a hole which compresses the fourth portion 220 towards the second portion 216.

It should be noted that all hold-downs disclosed herein can be configured to have two mirror image end sections where one of the end sections is a mirror image of the other end section, like those illustrated in FIGS 9 and 10. Further, it is within the scope of the present invention to connect any end section disclosed herein to any other end section disclosed herein or elsewhere.

The hold-downs of the present invention can be made from any suitable metal used for making hold-downs, such as stainless steel. Further, the hold-downs can be made from any suitable metal used for making electrical terminals, such as brass, phosphor bronze, beryllium copper and the like. The hold-down may be plated or coated with a layer, such as tin, lead, nickel, palladium, gold, silver or a suitable alloy. Further, the hold-downs can be made from materials with a tensile strength less than about 40,000 pounds per square inch (psi).

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. A lanced hold-down for holding a connector to a circuit assembly, comprising:

a first portion comprising a substantially flat strip having a pair of first sides and a pair of first edges;

a second portion connected to the first portion, the second portion comprising a substantially flat strip having a pair of second sides and a pair of second edges;

a third portion connected to the second portion, the third portion having a pair of third sides and at least one inclined edge configured to facilitate insertion into a hole through the circuit assembly;

a fourth portion connected to the third portion, the fourth portion comprising a substantially flat finger having a pair of fourth sides and at least three fourth edges, the fourth edges interconnecting the fourth sides, a first one of the fourth edges being a ramp for causing an interference fit with a wall of a hole through the circuit assembly, the first one of the fourth edges intersecting a second one of the fourth edges forming a barb such that the ramp allows easy insertion in the hole but the barb digs into the hole wall if the hold-down is withdrawn from the hole, the fourth portion being progressively farther away from the second portion as distance increases from the third portion;

one side of the pair of first sides, the pair of second sides, the pair of third sides and the pair of fourth sides being coplanar or substantially coplanar; and the other side of the pair of first sides, the pair of second sides, the pair of third sides and the pair of fourth sides being coplanar or substantially coplanar, such that when the hold-down is pressed into a hole through the circuit assembly, the ramp slides against the wall defining the hole and the fourth portion compresses towards the second portion forming an interference fit within the hole.

2. A lanced hold-down for holding a connector to a circuit assembly, comprising:

a first portion comprising a substantially flat strip having a pair of first sides and a pair of first edges;

a second portion connected to the first portion, the second portion comprising a substantially flat strip having a pair of second sides and a pair of second edges;

a third portion connected to the second portion, the third portion having a pair of third sides and at least one inclined edge configured to facilitate insertion into a hole through the circuit assembly;

a fourth portion connected to the third portion, the fourth portion comprising a substantially flat finger having a pair of fourth sides and at least three fourth edges, the fourth edges interconnecting the fourth sides, a first one of the fourth edges being a ramp for causing an interference fit with a wall of a hole through the circuit assembly, the first one of the fourth edges intersecting a second one of the fourth edges forming a barb such that the ramp allows easy insertion in the hole but the barb digs into the hole wall if the hold-down is withdrawn from the hole, the fourth portion being progressively farther away from the second portion as distance increases from the third portion; and a slight clearance D exists perpendicular or substantially perpendicular to the sides of the second portion or the fourth portion between the second portion and the fourth portion at the second edge of the fourth portion, such that when the hold-down is pressed into a hole through the circuit assembly, the ramp slides against the wall defining the hole and the fourth portion compresses towards the second portion forming an interference fit within the hole.

3. The lanced hold-down of claim 1 or 2 wherein: when the hold-down is pressed into a hole through the circuit assembly such that one of the pair of second edges and one of the pair of fourth edges compress against the wall defining the hole, the fourth portion will bend towards the second portion forming an interference fit within the hole.

4. The lanced hold-down of claim 1 or 2, wherein the first portion the second portion, the third portion and the fourth portion are parts of an electrical terminal solder tail.

5. The lanced hold-down of claim 1 or 2, wherein the fourth portion is spaced from the first portion by a gap such that when the terminal is inserted into a hole which compresses the fourth portion towards the second portion, the fourth portion will not contact the first portion before the fourth portion is compressed into space originally between the fourth portion and the second portion.

6. The lanced hold-down of claim 1 or 2, wherein the fourth portion is spaced from the first portion when the fourth portion is compressed to contact the second portion.

7. The lanced hold-down of claim 1 or 2, wherein:
the second portion and the fourth portion include mating inclined linear edges;
the inclined linear edge of the second portion interconnecting one of the pair of second edges and a shoulder edge extending perpendicularly from one of the pair of the first edges; and
the inclined linear edge of the fourth portion interconnecting one of the pair of fourth edges and a finger tip edge extending perpendicularly from the other one of the pair of the fourth edges.

8. The lanced hold-down of claim 1 or 2, wherein the width of the second portion plus the width of the fourth portion equals or substantially equals the width of the first portion.

9. The lanced hold-down of claim 1 or 2, further comprising:
a fifth portion connected to the third portion, the fifth portion comprising a substantially flat finger having a pair of fifth sides and a pair of fifth edges, the pair of fifth edges interconnecting the pair of fifth sides, the fifth portion being progressively farther away from the second portion as distance increases from the third portion;
one side of the pair of first sides, the pair of second sides, the pair of third sides, the pair of fourth sides and the pair of fifth sides being coplanar and
the other side of the pair of first sides, the pair of second sides, the pair of third sides, the pair of fourth sides and the pair of fifth sides being coplanar,
whereby when the hold-down is pressed into a hole through the circuit assembly such that one of the pair of fourth edges and one of the pair of fifth edges compress against the wall defining the hole, the fourth portion and the fifth portion will bend towards the second portion forming an interference fit within the hole.

10. The lanced hold-down of claim 9, wherein:
a plane perpendicular to the first, second and third sides bisects the first, second and third portions such that the terminal on either sides of the plane are substantially mirror images of one another.

11. The lanced hold-down of claim 9, wherein the width of the second portion plus the width of the fourth portion plus the width of the fifth portion equals or substantially equals the width of the first portion.

12. The lanced hold-down of claim 9, wherein the hold-down is made of a material with a tensile strength less than about 40,000 pounds per square inch.

13. A lanced hold-down for holding a connector to a circuit assembly, comprising:
a first portion comprising a substantially flat strip having a pair of first sides and a pair of first edges;
a second portion connected to the first portion, the second portion comprising a substantially flat strip having a pair of second sides and a pair of second edges;
a third portion connected to the second portion, the third portion having a pair of third sides and at least one inclined edge configured to facilitate insertion into a hole through the circuit assembly;
a fourth portion connected to the third portion, the fourth portion comprising a substantially flat finger having a pair of fourth sides and at least three fourth edges, the fourth edges interconnecting the fourth sides, a first one of the fourth edges being a ramp for causing an interference fit with a wall of a hole through the circuit assembly, the first one of the fourth edges intersecting a second one of the fourth edges forming a barb such that the ramp allows easy insertion in the hole but the barb digs into the hole wall if the hold-down is withdrawn from the hole, the fourth portion being progressively farther away from the second portion as distance increases from the third portion;
the first portion, the second portion, the third portion and the fourth portion comprise a first end section; and
a second end section comprising or substantially comprising a mirror image of the first end section, the second end section for insertion into a hole in a housing of the connector such that one of the pair of second edges in the second end section and one of the pair of fourth edges in the second end section compress against the housing wall defining the hole in the housing, the fourth portion in the second end section will bend towards the second portion in the second end section forming an interference fit within the hole in the housing,
such that when the hold-down is pressed into a hole through the circuit assembly, the ramp slides against the wall defining the hole and the fourth portion compresses towards the second portion forming an interference fit within the hole.

14. An electrical connector for mounting to a circuit assembly, comprising:
a dielectric housing having a plurality of passages through the housing;
a plurality of electrical terminals mounted in the passages, the terminals extending out of the passages and arranged in rows and columns for connection to conductive areas on the circuit assembly; and a lanced hold-down mounted to and extending from the housing, the lanced hold-down comprising:

a first portion comprising a substantially flat strip having a pair of first sides and a pair of first edges;

a second portion connected to the first portion, the second portion comprising a substantially flat strip having a pair of second sides and a pair of second edges;

a third portion connected to the second portion, the third portion having a pair of third sides and at least one inclined edge configured to facilitate insertion into a hole through the circuit assembly;

a fourth portion connected to the third portion, the fourth portion comprising a substantially flat finger having a pair of fourth sides and at least three fourth edges, the fourth edges interconnecting the fourth sides, a first one of the fourth edges being a ramp for causing an interference fit with a wall of a hole through the circuit assembly, the first one of the fourth edges intersecting a second one of the fourth edges forming a barb such that the ramp allows easy insertion in the hole but the barb digs into the hole wall if the hold-down is withdrawn from the hole, the fourth portion being progressively farther away from the second portion as distance increases from the third portion;

one side of the pair of first sides, the pair of second sides, the pair of third sides and the pair of fourth sides being coplanar or substantially coplanar; and the other side of the pair of first sides, the pair of second sides, the pair of third sides and the pair of fourth sides being coplanar or substantially coplanar, such that when the hold-down is pressed into a hole through the circuit assembly, the ramp slides against the wall defining the hole and the fourth portion compresses towards the second portion forming an interference fit within the hole.

15. An electrical connector for mounting to a circuit assembly, comprising:

a dielectric housing having a plurality of passages through the housing;

a plurality of electrical terminals mounted in the passages, the terminals extending out of the passages and arranged in rows and columns for connection to conductive areas on the circuit assembly; and a lanced hold-down mounted to and extending from the housing, the lanced hold-down comprising:

a first portion comprising a substantially flat strip having a pair of first sides and a pair of first edges;

a second portion connected to the first portion, the second portion comprising a substantially flat strip having a pair of second sides and a pair of second edges;

a third portion connected to the second portion, the third portion having a pair of third sides and at least one inclined edge configured to facilitate insertion into a hole through the circuit assembly;

a fourth portion connected to the third portion, the fourth portion comprising a substantially flat finger having a pair of fourth sides and at least three fourth edges, the fourth edges interconnecting the fourth sides, a first one of the fourth edges being a ramp for causing an interference fit with a small of a hold through the circuit assembly, the first one of the fourth edges intersecting a second one of the fourth edges forming a barb such that the ramp allows easy insertion in the hole but the barb digs into the hole wall if the hold-down is withdrawn from the hole, the fourth portion being progressively farther away from the second portion as distance increases from the third portion; and a slight clearance D exits perpendicular or substantially perpendicular to the sides of the second portion or the fourth portion between the second portion and the fourth portion at the second edge of the fourth portion, such that when the hold-down is pressed into a hole through the circuit assembly, the ramp slides against the wall defining the hole and the fourth portion compresses towards the second portion forming an interference fit within the hole.

16. The electrical connector of claim 14 or 15, wherein:

the plurality of electrical terminals are through-mount terminals having solder tails for inserting into and soldering to plated through-holes in the circuit assembly; and there is a pair of the lanced hold-downs arranged adjacent to one another at opposite ends of two different rows of the electrical terminals.

17. The electrical connector of claim 16, wherein:

the first portions, the second portions, the third portions and the fourth portions are parts of solder tails of the plurality of the electrical terminals.

18. The electrical connector of claim 14 or 15, wherein:

the plurality of electrical terminals are surface-mount terminals for soldering onto the conductive areas on the circuit assembly; and there are at least two of the lanced hold-downs arranged such that the fourth portion of at least one of the lanced hold-downs extends in a direction substantially opposite to the fourth portion of at least another one of the lanced hold-downs.

* * * * *